(12) United States Patent
Hayashi

(10) Patent No.: US 6,628,739 B1
(45) Date of Patent: Sep. 30, 2003

(54) DIGITAL PHASE LOCK LOOP CIRCUIT

(75) Inventor: Junichi Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/473,140

(22) Filed: Dec. 28, 1999

(30) Foreign Application Priority Data

Dec. 28, 1998 (JP) .......................................... 10-372641

(51) Int. Cl.[7] .............................................. H03D 3/24
(52) U.S. Cl. ..................................... 375/376; 327/156
(58) Field of Search ......................... 375/376; 327/147, 327/149, 150, 156, 158, 159; 331/1 R, 17, 25, 1 A

(56) References Cited

U.S. PATENT DOCUMENTS

| | | | | |
|---|---|---|---|---|
| 5,574,757 | A | * 11/1996 | Ogawa | 327/156 |
| 5,973,525 | A | * 10/1999 | Fujii | 327/149 |
| 5,990,730 | A | * 11/1999 | Shinozaki | 327/143 |
| 6,154,071 | A | * 11/2000 | Nogawa | 327/147 |

FOREIGN PATENT DOCUMENTS

| | | |
|---|---|---|
| JP | 64-20724 | 1/1989 |
| JP | 2-162834 | 6/1990 |
| JP | 6-85663 | 3/1994 |
| JP | 8-147967 | 6/1996 |
| JP | 9-293374 | 1/1997 |
| JP | 10-224215 | 8/1998 |

OTHER PUBLICATIONS

Korean Office Action dated Feb. 26, 2003 with partial English translation.

* cited by examiner

Primary Examiner—Don N. Vo
(74) Attorney, Agent, or Firm—McGinn & Gibb, PLLC

(57) ABSTRACT

The present invention provides a digital phase lock loop circuit having a phase comparator for comparing a reference clock signal with a reference frequency to a synchronous signal generated on the basis of the reference frequency to output an output signal representing a comparison result, a delay control system connected to the phase comparator for receiving the output signal from the phase comparator to control a delay of the synchronous signal in accordance with the output signal, wherein an input circuit is further provided which is connected to an input side of the phase comparator so that the reference clock signal is inputted through the input circuit to the phase comparator, and the input circuit discontinues the input of the reference clock signal to the phase comparator upon receipt of a discontinuation signal.

8 Claims, 6 Drawing Sheets wide phase comparison timing interval

DIGITAL PHASE LOCK LOOP CIRCUIT

BACKGROUND OF THE INVENTION

The present invention relates to a digital phase lock loop circuit for phase synchronizing of clock signals for data transmission, and more particularly to a digital phase lock loop circuit with a reduced consumed current.

The digital phase lock loop circuit multiplies a reference frequency of a reference clock signal to generate a synchronous signal which synchronizes with the reference clock signal. FIG. 1 is a block diagram illustrative of a conventional digital phase lock loop circuit. The conventional digital phase lock loop circuit is connected to an input circuit 101. The input circuit 101 receives an external clock signal CK to generate an internal reference clock signal CKin on the basis of the external clock signal CK. The conventional digital phase lock loop circuit receives the internal reference clock signal CKin from the input circuit 101. The conventional digital phase lock loop circuit comprises a delay line 102, a timing generator circuit 103, a phase comparator 104 and a delay control circuit 105.

The delay line 102 is connected to the input circuit 101 for receiving the internal reference clock signal CKin from the input circuit 101, so that the delay line 102 adds a delay value to the internal reference clock signal CKin to output the same from an output terminal OUT. The timing generator circuit 103 is also connected to the input circuit 101 for receiving the internal reference clock signal CKin from the input circuit 101, so that the timing generator circuit 103 outputs a delay control enable signal "EN" at a predetermined timing and also outputs a phase comparison enable signal "FCE" for every constant cycles. The phase comparator 104 is also connected to the input circuit 101 for receiving the internal reference clock signal CKin from the input circuit 101. The phase comparator 104 is also connected to the timing generator circuit 103 for receiving the phase comparison enable signal "FCE" from the timing generator circuit 103. The phase comparator 104 is also connected to an output side of the delay line 102 for receiving a feed-back clock signal "FBC". The phase comparator 104 compares phases of the internal reference clock signal CKin and the feed-back clock signal "FBC" upon receipt of the phase comparison enable signal "FCE", so as to generate a phase comparison signal "PCS".

The delay control circuit 105 is connected to the timing generator circuit 103 for receiving the delay control enable signal "EN" from the timing generator circuit 103. The delay control circuit 105 is also connected to the phase comparator 104 for receiving the phase comparison signal "PCS" from the phase comparator 104. The delay control circuit 105 generates a delay control signal "DCO" on the basis of the phase comparison signal "PCS" upon receipt of the delay control enable signal "EN". The delay control circuit 105 is also connected to the delay line 102 for sending the delay control signal "DCO" to the delay line 102, so that if the timing of the feed-back clock signal "FBC" is early, the delay line 102 is delayed, and if the timing of the feed-back clock signal "FBC" is delay, the delay line 102 is accelerated, whereby the feed-back clock signal "FBC" is made correspond to the internal reference clock signal CKin and then locked. After the feed-back clock signal "FBC" has been locked, then alternating acceleration and delay operations of the feed-back clock signal "FBC" are made by the delay line 102.

FIG. 2 is a timing chart illustrative of waveforms in operations of the conventional digital phase lock loop circuit of FIG. 1. A comparative cycle T1 is set to correspond to four clocks of the internal reference clock signal CKin. In the comparative cycle T1, the delay control signal "DCO" is outputted so that a switching operation of the delay line 102 is conducted. Operations of outputting the phase comparison enable signal "FCE" from the timing generator circuit 103 for every four clocks of the internal reference clock signal CKin and operations of outputting the delay control signal "DCO" from the delay control circuit 105 for the comparative cycle T1 are sequentially conducted.

If the phase lock loop circuit is mounted on a dynamic random access memory, then the above output operation is executed normally even in the pre-charge stand-by after the locking and outputting a signal representing the self-refresh. In case of DRAM, if the read out and write operations are normally executed, in the pre-charge stand-by or self-refresh, no read out operation nor write operation is executed whereby a consumed current is reduced. For example, a note type personal computer is operable by a battery as a power. During no operation of the read or write operation, almost no current consumption is made to prolong a life-time of the battery.

In recent years, the semiconductor device with the DRAM is likely to accommodate the digital phase lock loop circuit in response to the requirement for accurate data transmissions. In this circumstances, the digital phase lock loop circuit has been improved to shorten the necessary time for locking the signal and for reduction in fluctuation. However, the digital phase lock loop circuit is usually operated in the pre-charge stand-by state or self-refresh operation even the current consumption may further be reduced.

In the above circumstances, it had been required to develop a novel digital phase lock loop circuit free from the above problem.

SUMMARY OF THE INVENTION

Accordingly, it is an object of the present invention to provide a novel digital phase lock loop circuit free from the above problems.

It is a further object of the present invention to provide a novel digital phase lock loop circuit which is capable of reducing a current consumption in a pre-charge stand-by state or a self-refresh operation.

The present invention provides a digital phase lock loop circuit having a phase comparator for comparing a reference clock signal with a reference frequency to a synchronous signal generated on the basis of the reference frequency to output an output signal representing a comparison result, a delay control system connected to the phase comparator for receiving the output signal from the phase comparator to control a delay of the synchronous signal in accordance with the output signal, wherein an input circuit is further provided which is connected to an input side of the phase comparator so that the reference clock signal is inputted through the input circuit to the phase comparator, and the input circuit discontinues the input of the reference clock signal to the phase comparator upon receipt of a discontinuation signal.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
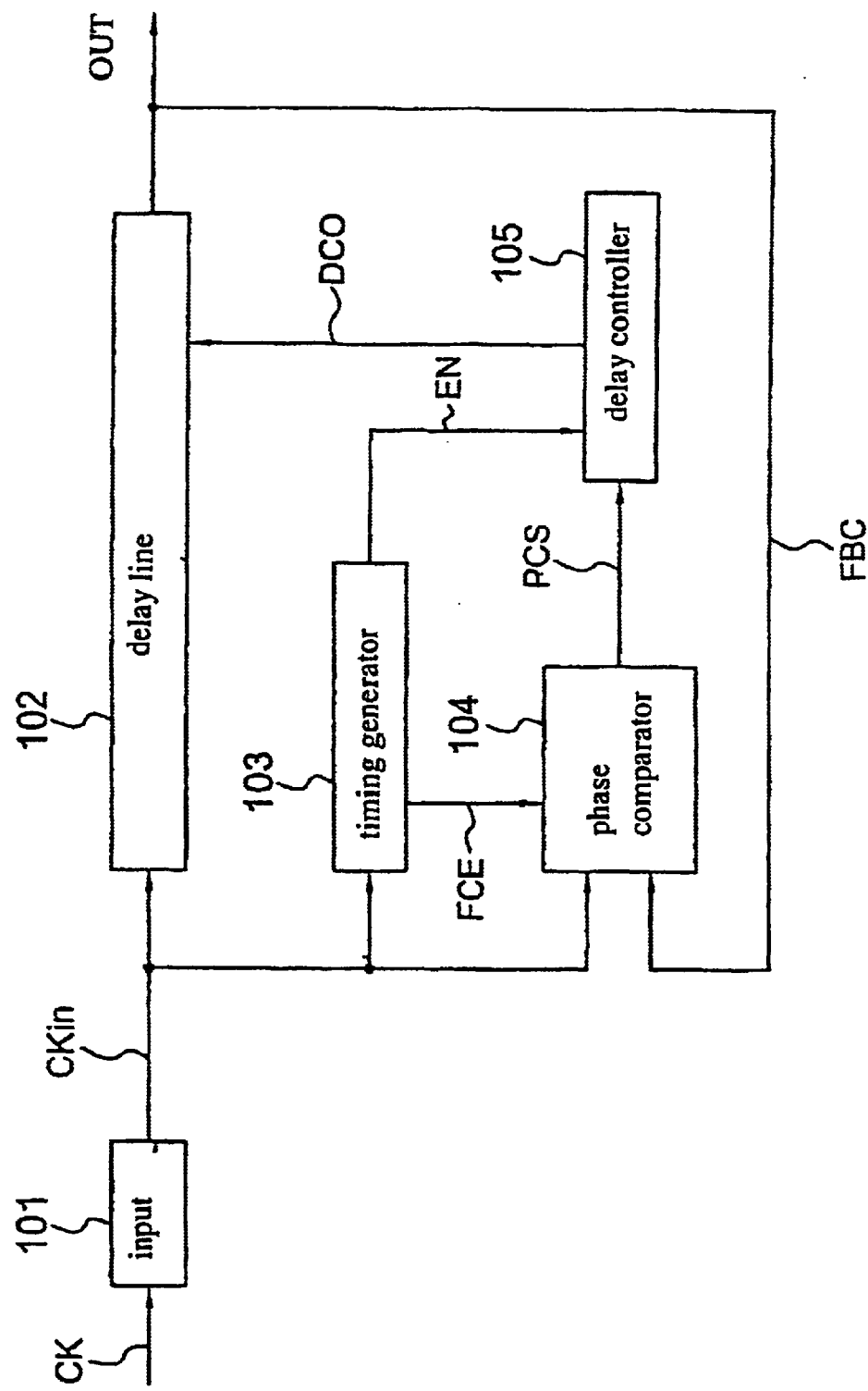
FIG. 1 is a block diagram illustrative of a conventional digital phase lock loop circuit.
Figure 2:
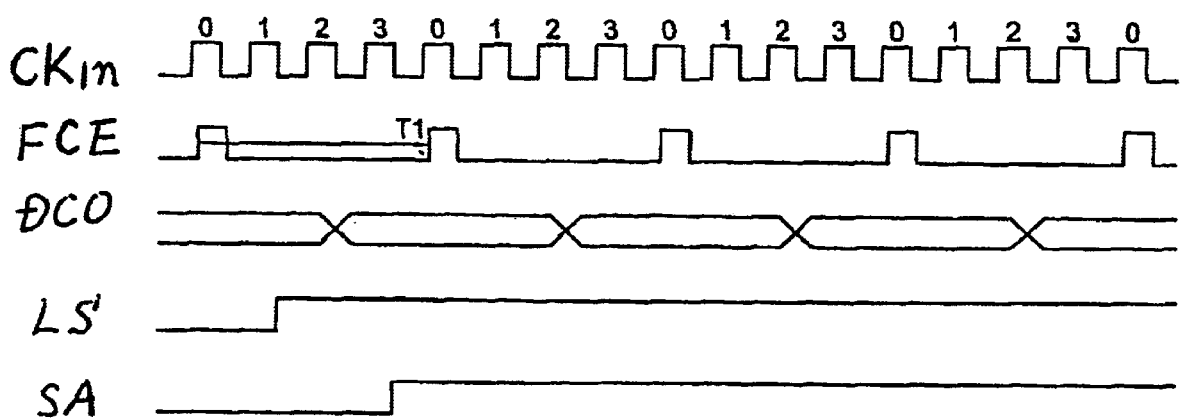
FIG. 2 is a timing chart illustrative of waveforms in operations of the conventional digital phase lock loop circuit of FIG. 1.

The present invention provides a digital phase lock loop circuit having a phase comparator for comparing a reference clock signal with a reference frequency to a synchronous signal generated on the basis of the reference frequency to output an output signal representing a comparison result, a delay control system connected to the phase comparator for receiving the output signal from the phase comparator to control a delay of the synchronous signal in accordance with the output signal, wherein an input circuit is further provided which is connected to an input side of the phase comparator so that the reference clock signal is inputted through the input circuit to the phase comparator, and the input circuit discontinues the input of the reference clock signal to the phase comparator upon receipt of a discontinuation signal.

The discontinuation signal represents a pre-charge stand-by after locking or self-refresh, so that the phase lock loop circuit is discontinued to operate in the pre-charge stand-by after locking or in the self-refresh, whereby a further reduction in current consumption can be obtained.

It is preferable that during discontinuation of the input of the reference clock signal, another reference clock signal is periodically supplied to allow the phase lock loop circuit to operate, so that if a time period of the pre-charge stand-by or a time period of self-refresh is so long, the phase lock loop circuit is allowed to operate to prevent a problem with a large difference of the synchronies signal from the reference clock signal.

The present invention also provides a digital phase lock loop circuit having a phase comparator for comparing a reference clock signal with a reference frequency to a synchronous signal generated on the basis of the reference frequency to output an output signal representing a comparison result, a delay control system connected to the phase comparator for receiving the output signal from the phase comparator to control a delay of the synchronous signal in accordance with the output signal, wherein before a fee-back portion of the synchronous signal to the phase comparator is locked, the delay control system outputs an operation enable signal to the phase comparator in a first comparative cycle, and after the fee-back portion has been locked, then the delay control system outputs the operation enable signal in a second comparative cycle which is longer than the first comparative cycle. The comparative cycle after the synchronous signal has been locked is made longer than the comparative cycle before the synchronous signal is locked, in order to reduce the current consumption, whereby it is possible to further reduce the current consumption in the pre-charge stand-by after the synchronous signal has been locked.

It is also preferable that the delay control system has a plurality of timing counters so that the delay control system switches the plural timing counters to switch the first and second comparative cycles.

It is further preferable that the delay control system switches the second comparative cycle to the first comparative cycle when a difference of the feed-back portion of the synchronous signal from the reference clock signal becomes larger than a predetermined value, so that a compensation to the synchronous signal can be made.

PREFERRED EMBODIMENT

Figure 3:
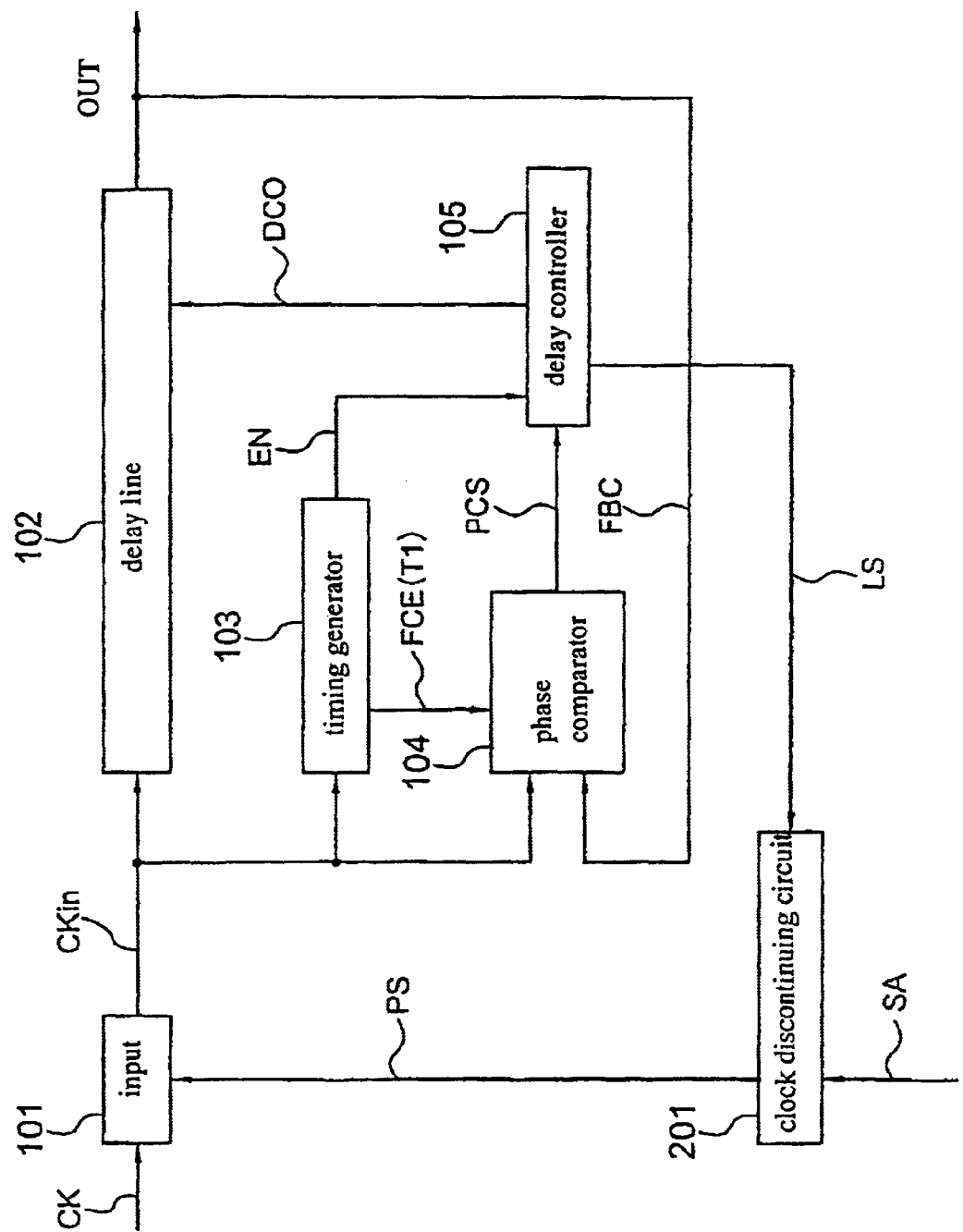
FIG. 3 is a block diagram illustrative of a first novel digital phase lock loop circuit in a first embodiment according to the present invention.

A first embodiment according to the present invention will be described in detail with reference to the drawings. FIG. 3 is a block diagram illustrative of a first novel digital phase lock loop circuit in a first embodiment according to the present invention. The first novel digital phase lock loop circuit is connected to all input circuit 101. The input circuit 101 receives an external clock signal CK to generate an internal reference clock signal CKin on the basis of the external clock signal CK. The first novel digital phase lock loop circuit receives the internal reference clock signal CKin from the input circuit 101. The novel digital phase lock loop circuit comprises a clock discontinuing circuit 201, a delay line 102, a timing generator circuit 103, a phase comparator 104 and a delay control circuit 105.

The delay line 102 is connected to the input circuit 101 for receiving the internal reference clock signal CKin from the input circuit 101, so that the delay line 102 adds a delay value to the internal reference clock signal CKin to output the same from an output terminal OUT. The timing generator circuit 103 is also connected to the input circuit 101 for receiving the internal reference clock signal CKin from the input circuit 101, so that the timing generator circuit 103 outputs a delay control enable signal "EN" at a predetermined timing and also outputs a phase comparison enable signal "FCE" for every constant cycles. The phase comparator 104 is also connected to the input circuit 101 for receiving the internal reference clock signal CKin from the input circuit 101. The phase comparator 104 is also connected to the timing generator circuit 103 for receiving the phase comparison enable signal "FCE" from the timing generator circuit 103. The phase comparator 104 is also connected to an output side of the delay line 102 for receiving a feed-back clock signal "FBC". The phase comparator 104 compares phases of the internal reference clock signal CKin and the feed-back clock signal "FBC" upon receipt of the phase comparison enable signal "FCE", so as to generate a phase comparison signal "PCS".

The delay control circuit 105 is connected to the timing generator circuit 103 for receiving the delay control enable signal "EN" from the timing generator circuit 103. The delay control circuit 105 is also connected to the phase comparator 104 for receiving the phase comparison signal "PCS" from the phase comparator 104. The delay control circuit 105 generates a delay control signal "DCO" on the basis of the phase comparison signal "PCS" upon receipt of the delay control enable signal "EN". The delay control circuit 105 is also connected to the delay line 102 for sending the delay control signal "DCO" to the delay line 102, so that if the timing of the feed-back clock signal "FBC" is early, the delay line 102 is delayed, and if the timing of the feed-back clock signal "FBC" is delay, the delay line 102 is accelerated, whereby the feed-back clock signal "FBC" is made correspond to the internal reference clock signal CKin and then locked. After the feed-back clock signal "FBC" has been locked, then alternating acceleration and delay operations of the feed-back clock signal "FBC" are made by the delay line 102.

The clock discontinuing circuit 201 is connected to the input circuit 101 and also connected to the delay control circuit 105. The clock discontinuing circuit 201 generates a first stage discontinuing signal PS in a pre-charge stand-by state and a self-refresh after a feed-back clock FBC has been locked, so that a current for operating the input circuit 101 can be eliminated, and further the reference clock signal CKin is not inputted, whereby the operation of the digital phase lock loop circuit is discontinued to curtail the current consumption. After the pre-charge stand-by time period or the self-refresh time period has been finished, then the clock discontinuing circuit 201 discontinues the output of the first stage discontinuing signal PS so as to allow the input circuit 101 to re-start to input the reference clock signal CKin, whereby the digital phase lock loop circuit is re-operated. After the feed-back synchronous signal has been locked, then the clock discontinuing circuit 201 discontinues the operation of the input circuit 101 so that the comparative cycle Ti as a phase comparison timing is made wider than in the normal state, wherein the digital phase lock loop circuit is operated. After the phase comparison has been made, then the digital phase lock loop circuit remains not operated until a next phase comparison from switching a delay value by the delay line 102 whereby the current consumption can be reduced.

In this embodiment, the delay control circuit 105 monitors the lock state so that when the feed-back clock FBC is locked at the reference clock CKin, the clock signal LS is transmitted from the delay control circuit 105 to the clock discontinuing circuit 201. It is also possible to provide the phase comparator 104 with a monitor function for monitoring the lock state.

The clock discontinuing circuit 201 is made active upon receipt of the clock signal LS, so that the clock discontinuing circuit 201 sends the first stage discontinuing signal PS to the clock input circuit 101 upon the discontinuing signal SA representing the pre-charge stand-by or the self-refresh. Upon input of the first stage discontinuing signal PS to the clock input circuit 101, the operation of the clock input circuit 101 is discontinued, whereby supply of the reference clock signal CKin to the delay line 102, the timing generator circuit 103 and the phase comparator 104 is discontinued, and the fee-back clock FBC from the delay line 102 is discontinued. For those reasons, the above enable signals FCE and EN are not outputted, whereby the digital phase lock loop circuit remains in the current state and remains not operated. The current comsumptions to the input circuit 101 and the operation of the digital phase lock loop circuit can be eliminated.

Figure 4:
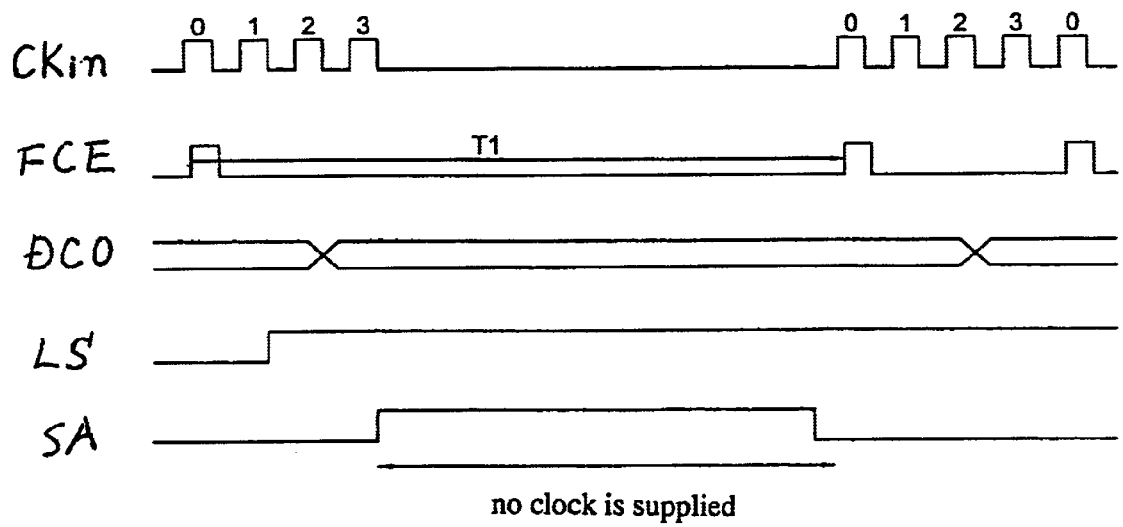
FIG. 4 is a timing chart illustrative of waveforms in operations of the novel digital phase lock loop circuit of FIG. 3.

FIG. 4 is a timing chart illustrative of waveforms in operations of the novel digital phase lock loop circuit of FIG. 3. A comparative cycle T1 is set to correspond to four clocks of the internal reference clock signal CKin.

After the feed-back clock FBC has been locked, then the discontinuing signal SA representing the pre-charge stand-by o the self-refresh is inputted into the clock discontinuing circuit 201, whereby the first stage discontinuing signal PS is sent from the clock discontinuing circuit 201 to the input circuit 101. The operation of the input circuit 101 is discontinued, whereby the supply of the reference clock signal CKin to the digital phase lock loop circuit is discontinued. Until $0^{th}$ clock in the comparative cycle T1 is inputted, the phase comparison enable signal FCE is not outputted. The other enable signals such as the enable signal EN to the delay control circuit 105 are not supplied, the digital phase lock loop circuit remains in the current state and not operated.

Thereafter, the pre-charge stand-by state time period or the self-refresh time period has been finished, then the clock discontinuing circuit 201 discontinues the output of the first stage discontinuing signal PS, whereby the input circuit 101 returns to the operation to initiate supply of the reference clock signal CKin, so that the digital phase lock loop circuit returns to operational state.

If the time period of the pre-charge stand-by state or the time period of the self-refresh state is so long that a large difference of the feed-back clock FBC from the reference clock signal CKin is generated, then it is optionally possible to provide an additional counter for use of another clock from the reference clock signal CKin, so that the following functions can be added to the clock discontinuing circuit 201. Namely, during the time periods of the pre-charge stand-by state or the self-refresh state, the supply of the reference clock signal CKin remains discontinued, during which another clock signal is supplied periodically at a constant time interval within a predetermined time period in order to allow the digital phase clock loop circuit to operate and to compensate the feed-back clock FBC.

If the time period of the pre-charge stand-by state or the time period of the self-refresh state is so long that a large difference of the feed-back clock FBC from the reference clock signal CKin is generated, then it is optionally possible to discontinue immediately the output of the first stage discontinuing signal PS to allow the input circuit 101 to operate so that the digital phase clock loop circuit returns to the operational state. In this case, the digital phase clock loop circuit is operated at a constant time interval without complete discontinuation of the operation in the pre-charge stand-by state time period, whereby the phase comparison between the reference clock signal CKin and the fee-back clock FBC is made. A detector circuit is further provided for detecting a difference in phase between the reference clock signal CKin and the fee-back clock FBC, so that if the difference is beyond the predetermined value, then a signal is outputted to return the digital phase lock loop circuit to the operational state.

In accordance with the first embodiment, during the time period of the discontinuation of the input circuit 101, the reference clock signal CKin is not supplied to discontinue the digital phase lock loop circuit, so as to reduce the current comsumption in the pre-charge stand-by state or in the self-refresh state. After the time periods of the pre-charge stand-by state or the self-refresh state has been finished, then the input circuit returns to the operational state to allow the digital phase lock loop circuit to operate.

Figure 5:
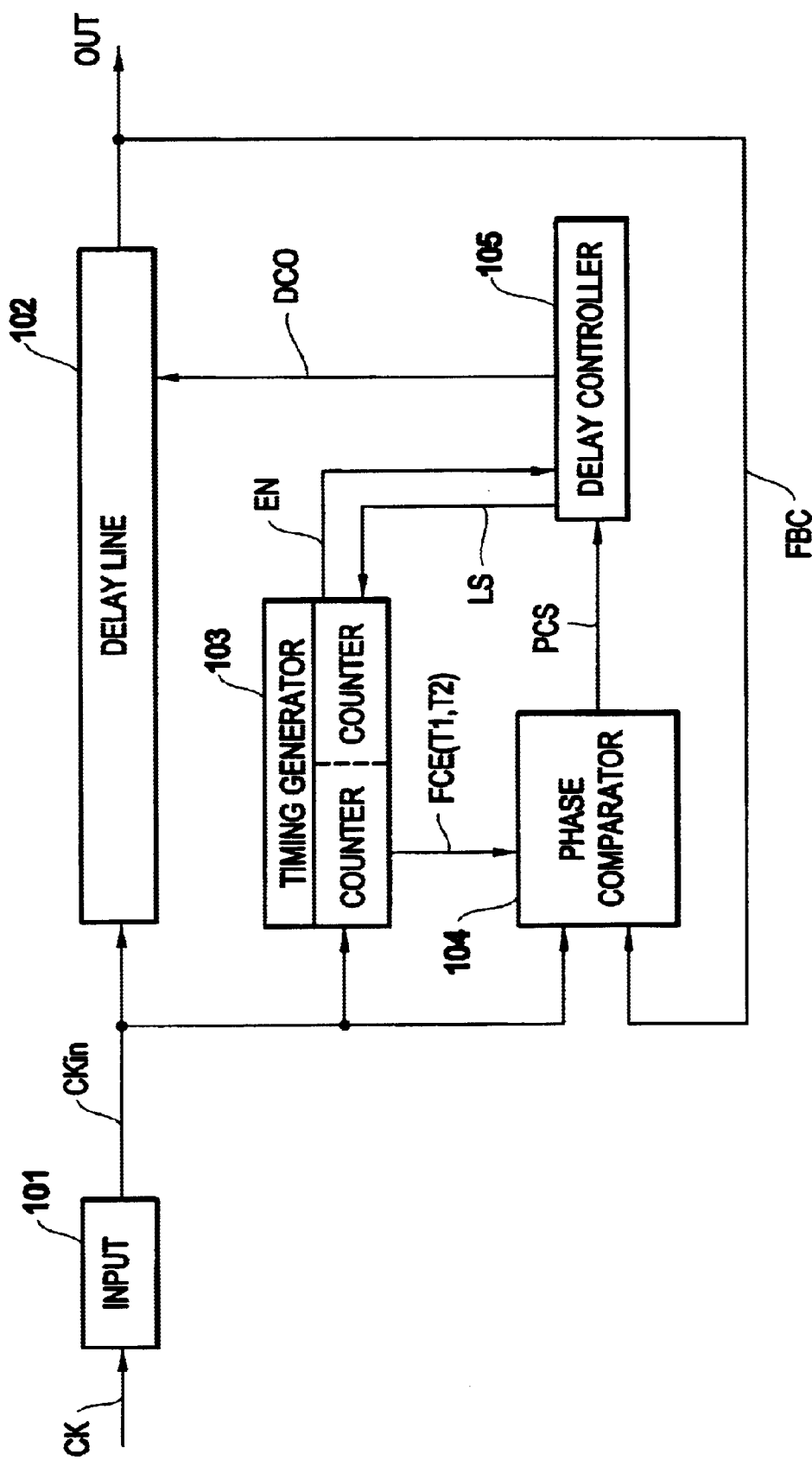
FIG. 5 is a block diagram illustrative of a second novel digital phase lock loop circuit in a second embodiment according to the present invention.

A second embodiment according to the present invention will be described in detail with reference to the drawings. FIG. 5 is a block diagram illustrative of a second novel digital phase lock loop circuit in a second embodiment according to the present invention. The second novel digital phasic lock loop circuit is connected to an input circuit 101. The input circuit 101 receives an external clock signal CK to generate an internal reference clock signal CKin on the basis of the external clock signal CK The second novel digital phase lock loop circuit receives the internal reference clock signal CKin from the input circuit 101. The novel digital phase lock loop circuit comprises a delay line 102, a timing generator circuit 103, a phase comparator 104 and a delay control circuit 105.

The delay line 102 is connected to the input circuit 101 for receiving the internal reference clock signal CKin from the input circuit 101, so that the delay line 102 adds a delay value to the internal reference clock signal CKin to output the same from an output terminal OUT. The timing generator circuit 103 is also connected to the input circuit 101 for receiving the internal reference clock signal CKin from the input circuit 101, so that the timing generator circuit 103 outputs a delay control enable signal "EN" at a predetermined timing and also outputs a phase comparison enable signal "FCE" for every constant cycles. The phase comparator 104 is also connected to the input circuit 101 for receiving the internal reference clock signal CKin from the input circuit 101. The phase comparator 104 is also connected to the timing generator circuit 103 for receiving the phase comparison enable signal "FCE" from the timing generator circuit 103. The phase comparator 104 is also connected to an output side of the delay line 102 for receiving a feed-back clock signal "FBC". The phase comparator 104 compares phases of the internal reference clock signal CKin and the feed-back clock signal "FBC" upon receipt of the phase comparison enable signal "FCE", so as to generate a phase comparison signal "PCS".

The delay control circuit 105 is connected to the timing generator circuit 103 for receiving the delay control enable signal "EN" from the timing generator circuit 103. The delay control circuit 105 is also connected to the phase comparator 104 for receiving the phase comparison signal "PCS" from the phase comparator 104. The delay control circuit 105 generates a delay control signal "DCO" on the basis of the phase comparison signal "PCS" upon receipt of the delay control enable signal "EN". The delay control circuit 105 is also connected to the delay line 102 for sending the delay control signal "DCO" to the delay line 102, so that if the timing of the feed-back clock signal "FBC" is early, the delay line 102 is delayed, and if the timing of the feed-back clock signal "FBC" is delay, the delay line 102 is accelerated, whereby the feed-back clock signal "FBC" is made correspond to the internal reference clock signal CKin and then locked. After the feed-back clock signal "FBC" has been locked, then alternating acceleration and delay operations of the feed-back clock signal "FBC" are made by the delay line 102.

In this second embodiment, no clock discontinuing circuit is provided. The delay control circuit 105 generates a clock signal LC. The timing generator circuit 103 has a variable counter for enable signal outputs.

When the feed-back clock FBC is clocked at the reference clock signal CKin, the delay control circuit 105 sends a lock signal LC to the timing generator circuit 103. The timing generator circuit 103 is provided with a plurality of timing counters for enable signal outputs. Similarly to the first embodiment, the timing generator circuit 103 is capable of outputting the phase comparative enable signal FCE. During the normal operation, the timing generator circuit 103 outputs a delay control enable signal EN in the first comparative cycle T1. Upon the input of the lock signal LS into the timing generator circuit 103, the timing generator circuit 103 switches the timing counters so that the timing generator circuit 103 outputs the enable signal in the second comparative cycle T2 which is longer than the first comparative cycle T1.

After the feed-back clock FBC is clocked, the phase comparison is made in the second comparative cycle T2 which is wider than the first comparative cycle T1. The digital phase lock loop circuit remains not operated until the next phase comparison after switching the delay value by the delay time 102, to reduce or curtail the current comsumption. For those reasons, in the pre-charge stand-by state or self-refresh after the feed-back clock FBC has been clocked, the current comsumption can be reduced.

Figure 6:
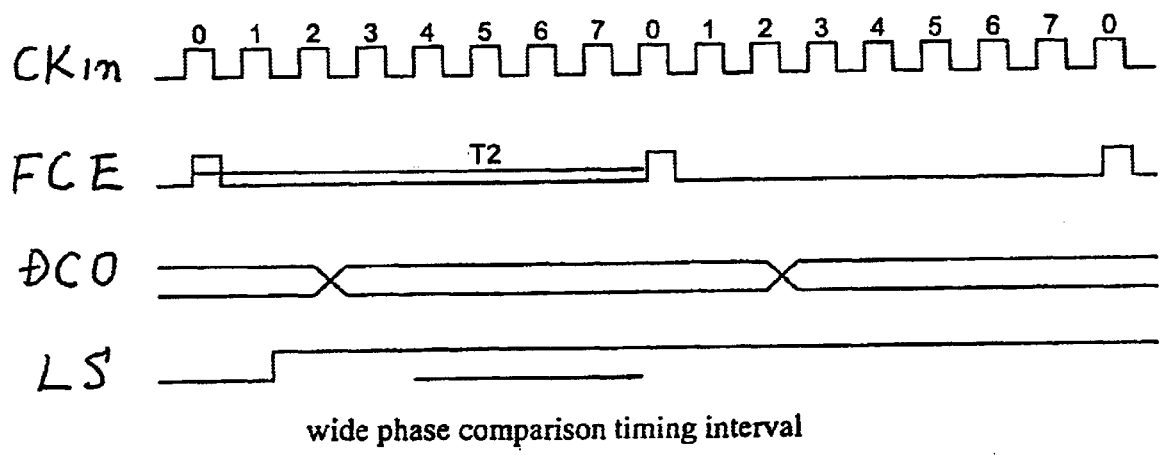
FIG. 6 is a timing chart illustrative of waveforms in operation of the digital phase lock loop circuit of FIG. 5 wherein a second comparative cycle T2 is set to correspond to eight clocks.

FIG. 6 is a timing chart illustrative of waveforms in operation of the digital phase lock loop circuit of FIG. 5 wherein a second comparative cycle T2 is set to correspond to eight clocks. The phase comparison enable signal FCE is outputted for every second comparative cycle T2 which corresponds to the eight clocks. The delay control circuit 105 sends the delay control signal DCO for switching the delay value to the delay line 102 upon receipt of the phase comparison signal PCS as the phase comparison result from the phase comparator 104.

The delay control signal DCO is outputted within four clocks similarly to the normal operation in the first comparative cycle T1. The digital phase lock loop circuit remains in the current state until the delay control enable signal EN is re-outputted after the delay control signal DCO has been outputted. The digital phase lock loop circuit remains not operated until the next output o the enable signal after the delay value was switched, whereby the current comsumption is curtailed. If a difference of the feed-back clock FBC from the reference clock signal CKin becomes larger than the predetermined value, then the second comparative cycle T2 returns to the first comparative cycle T1, so as to immediately compensate the feed-back clock FBC, In this second embodiment, the lock signal LS serves as an enable signal for switching the counters in the timing generator circuit 103 so that in response to the pre-charge stand-by signal or the self-refresh signal, the enable signal is outputted to switch the counter in order to reduce the current comsumption.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A digital phase lock loop circuit, comprising:
    a phase comparator that compares an internal reference clock signal with a reference frequency to an external feed-back clock signal, which is outputted from the digital phase lock loop circuit and generated from the reference frequency, and that outputs a phase comparison signal; and
    a delay control circuit that receives the phase comparison signal from the phase comparator and controls a delay of a synchronous signal in accordance with the phase comparison signal,
        wherein after the external feed-back clock signal to the phase comparator is locked, the delay control circuit outputs a lock signal to a timing generator in a first comparative cycle, after which, the timing generator outputs a delay control enable signal in a second comparative cycle that is longer than the first comparative cycle.

2. The digital phase lock loop circuit as claimed in claim 1, wherein the timing generator includes a plurality of timing counters, so that, at least one of the plurality of timing counters switches the delay control circuit from the first comparative cycle to the second comparative cycle.

3. The digital phase lock loop circuit as claimed in claim 2, wherein the timing generator switches the second comparative cycle to the first comparative cycle, when a difference of the feed-back clock signal from the reference clock signal becomes larger than a predetermined value.

4. A digital phase lock loop circuit, comprising:

a delay line that receives an internal reference clock signal and externally outputs a feed-back clock signal from the digital phase lock loop circuit;

a phase comparator that receives the internal reference clock signal and the feed-back clock signal and outputs a phase comparison signal; and a delay control circuit that provides a delay to the delay line, based on the phase comparison signal, when a delay enable signal is provided by a timer internal to the digital phase lock loop circuit, wherein a clock discontinuing circuit provides an input stage discontinuing signal to the input circuit, after receipt of a phase lock signal from the delay control circuit and upon receipt of an external discontinuing signal.

5. The digital phase lock loop as claimed in claim 4, further comprising an input circuit that receives an external clock signal and outputs the internal reference clock signal, which is based on a frequency of the external clock signal.

6. The digital phase lock loop as claimed in claim 4, further comprising a timing generator that receives the internal reference clock signal and includes a timer, which provides the delay enable signal.

7. The digital phase lock loop as claimed in claim 6, wherein when the delay control circuit sends a phase lock state signal to the timing generator during a first comparative cycle, the timing generator switches to a second comparative cycle that is longer than the first comparative cycle to delay the delay enable signal.

8. The digital phase lock loop as claimed in claim 7, wherein the timing generator switches from the second comparative cycle to the first comparative cycle, when a difference of the feed-back clock signal from the internal reference clock signal becomes larger than a predetermined value.

* * * * *